(12) United States Patent
Chen et al.

(10) Patent No.: US 7,425,346 B2
(45) Date of Patent: Sep. 16, 2008

(54) METHOD FOR MAKING HYBRID DIELECTRIC FILM

(75) Inventors: Chieh Chen, Palo Alto, CA (US); Atul Kumar, Santa Clara, CA (US); Yuri Pikovsky, San Jose, CA (US); Chung J. Lee, Fremont, CA (US)

(73) Assignee: Dielectric Systems, Inc., Fremont, CA (US)

( * ) Notice: Subject to any disclaimer, the term of this patent is extended or adjusted under 35 U.S.C. 154(b) by 792 days.

(21) Appl. No.: 10/936,156

(22) Filed: Sep. 7, 2004

(65) Prior Publication Data

US 2006/0051972 A1    Mar. 9, 2006

Related U.S. Application Data

(63) Continuation-in-part of application No. 10/854,776, filed on May 25, 2004, which is a continuation-in-part of application No. 10/243,990, filed on Sep. 13, 2002, now abandoned, and a continuation-in-part of application No. 10/141,358, filed on May 8, 2002, now abandoned, which is a continuation-in-part of application No. 10/126,919, filed on Apr. 19, 2002, now abandoned, which is a continuation-in-part of application No. 10/125,626, filed on Apr. 18, 2002, now abandoned, which is a continuation-in-part of application No. 10/116,724, filed on Apr. 4, 2002, now Pat. No. 6,881,447, which is a continuation-in-part of application No. 10/115,879, filed on Apr. 4, 2002, now abandoned, which is a continuation-in-part of application No. 10/029,373, filed on Dec. 20, 2001, now abandoned, which is a continuation-in-part of application No. 10/028,198, filed on Dec. 20, 2001, now Pat. No. 6,797,343, which is a continuation-in-part of application No. 09/925,712, filed on Aug. 9, 2001, now Pat. No. 6,703,462, which is a continuation-in-part of application No. 09/795,217, filed on Feb. 26, 2001, now Pat. No. 6,825,303.

(51) Int. Cl.
*B05D 5/12*    (2006.01)
*C23C 16/18*    (2006.01)

(52) U.S. Cl. .................... 427/97.1; 427/97.2; 427/97.4; 427/255.6; 438/763; 438/778; 438/780

(58) Field of Classification Search ................. 438/763, 438/778, 780; 427/255.6, 515, 578, 99, 96.8, 427/97.1, 97.2, 97.4
See application file for complete search history.

(56) References Cited

U.S. PATENT DOCUMENTS 6,068,884 A * 5/2000 Rose et al. .................. 438/762

(Continued)

FOREIGN PATENT DOCUMENTS

WO    WO/2004/044978    *  5/2004

OTHER PUBLICATIONS

Han, K., et al., "Stable and robust low-voltage pentacene transistor based on a hybrid dielectric". Microelectronic Engineering, vol. 84, Issues 9-10, Sep./Oct. 2007, pp. 2173-2176.*

*Primary Examiner*—Bret Chen
(74) *Attorney, Agent, or Firm*—Allerman Hall McCoy Russell & Tuttle LLP

(57) ABSTRACT

A method of forming a hybrid inorganic/organic dielectric layer on a substrate for use in an integrated circuit is provided, wherein the method includes forming a first dielectric layer on the substrate via chemical vapor deposition, and forming a second dielectric layer on the first dielectric layer via chemical vapor deposition, wherein one of the first dielectric layer and the second dielectric layer is formed from an organic dielectric material, and wherein the other of the first dielectric layer and the second dielectric layer is formed from an inorganic dielectric material.

20 Claims, 4 Drawing Sheets

U.S. PATENT DOCUMENTS

| | | |
|---|---|---|
| 6,255,735 B1 | 7/2001 | Wang et al. |
| 6,287,961 B1 | 9/2001 | Liu et al. |
| 6,383,919 B1 | 5/2002 | Wang et al. |
| 6,391,757 B1 * | 5/2002 | Huang et al. ................ 438/597 |
| 6,486,557 B1 * | 11/2002 | Davis et al. ................ 257/758 |
| 6,603,204 B2 * | 8/2003 | Gates et al. ................ 257/760 |
| 6,677,680 B2 | 1/2004 | Gates et al. |
| 6,743,713 B2 * | 6/2004 | Mukherjee-Roy et al. ... 438/638 |
| 6,965,169 B2 * | 11/2005 | Lu et al. ..................... 257/778 |
| 2007/0001306 A1 * | 1/2007 | Su et al. ..................... 257/758 |

* cited by examiner

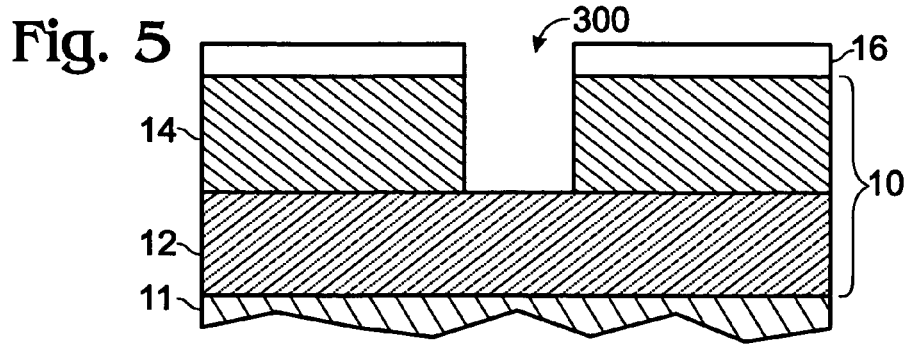
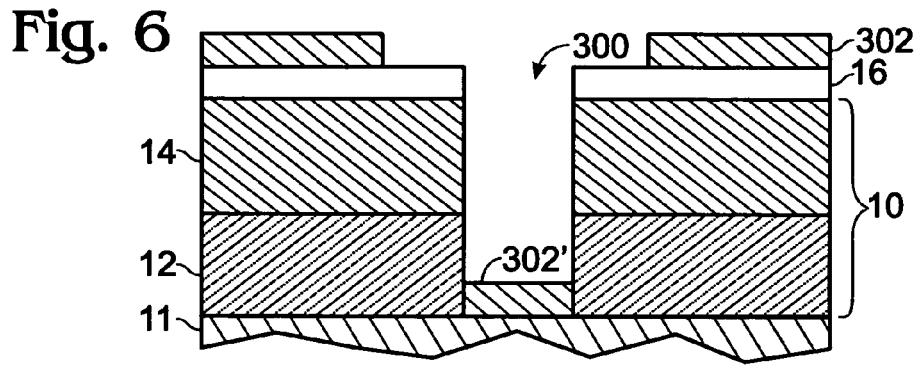
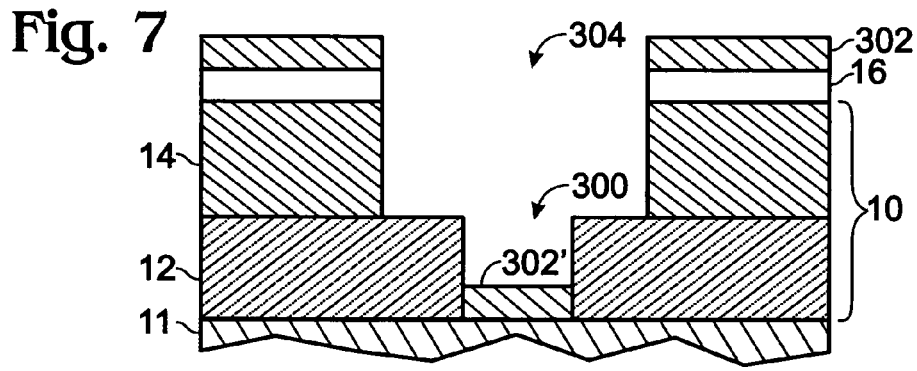
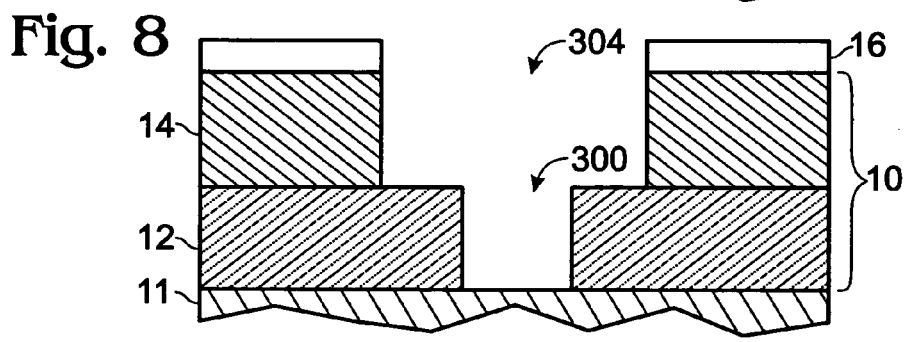
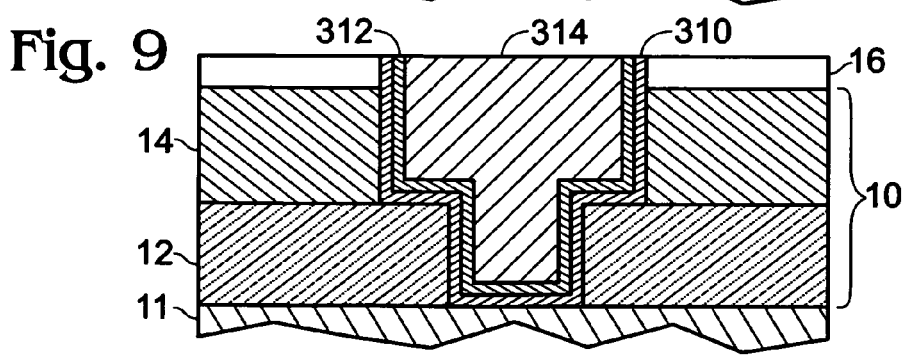

METHOD FOR MAKING HYBRID DIELECTRIC FILM

CROSS-REFERENCE TO RELATED APPLICATIONS

The present application is a continuation-in-part of, and claims priority under 35 U.S.C. § 120 to, U.S. patent application Ser. No. 10/854,776, filed May 25, 2004.

U.S. patent application Ser. No. 10/854,776 is a continuation-in-part of U.S. patent application Ser. No. 10/243,990, filed Sep. 13, 2002 now abandoned, and U.S. patent application Ser. No. 10/141,358, filed May 8, 2002 now abandoned.

U.S. patent application Ser. No. 10/141,358 is a continuation-in-part of U.S. patent application Ser. No. 10/126,919, filed Apr. 19, 2002 now abandoned, which is a continuation-in-part of U.S. patent application Ser. No. 10/125,626, filed Apr. 18, 2002 now abandoned, which is a continuation-in-part of U.S. patent application Ser. No. 10/115,879, filed Apr. 4, 2002 now abandoned, which is a continuation-in-part of U.S. patent application Ser. No. 10/116,724, filed Apr. 4, 2002 now U.S. Pat. No. 6,881,447, which is a continuation-in-part of U.S. patent application Ser. No. 10/029,373, filed Dec. 20, 2001 now abandoned, which is a continuation-in-part of U.S. patent application Ser. No. 10/028,198, filed Dec. 20, 2001 now U.S. Pat. No. 6,797,343, which is a continuation-in-part-of U.S. patent application Ser. No. 09/925,712, filed Aug. 9, 2001 now U.S. Pat No. 6,703,462 which is a continuation-in-part of U.S. patent application Ser. No. 09/795,217, filed Feb. 26, 2001 now U.S. Pat No. 6,825,303.

The disclosures of all of the above applications are hereby incorporated by reference in their entirety for all purposes.

BACKGROUND

Integrated circuits contain many different layers of materials, including dielectric layers that insulate adjacent conducting layers from one another. With each decrease in the size of integrated circuits, the individual conducting layers and elements within the integrated circuits grow closer to adjacent conducting elements. This necessitates the use of dielectric layers made of materials with low dielectric constants to prevent problems with capacitance, cross talk, etc. between adjacent conducting layers and elements.

The use of copper as conductive lines in integrated circuits has allowed further size reductions to be achieved. Copper interconnects are typically formed via damascene processes. In the so-called dual damascene process, which is used to fabricate integrated circuits with, for example, 130 nm and smaller technology nodes, a copper interconnect is formed by etching a via completely through a dielectric layer, etching a trench that overlaps the via partially through the dielectric layer, filling the trench and via with an electrically conductive material via a plating process, and then removing excess conductive material from surfaces adjacent to the via and trench by a polishing process.

Where the dielectric layer is formed from a single low dielectric constant ("low k") material, the process may be referred to as a "monolithic dual damascene" process. Monolithic dual damascene processes typically utilize a dielectric layer having an etch stop layer disposed between a first layer and a second layer of a low k material. The etch stop layer helps to stop the trench etch at a precise, reproducible depth in the dielectric layer.

The etch stop layer is typically made of a material with a different etching chemistry than the surrounding dielectric layer. For example, where an organic low k material is used for the dielectric layer, the etch stop may be formed from a silicon oxide-based material. In this case, an oxygen-containing plasma, for example, may be used to etch the organic material, as this etching process would substantially stop upon reaching the silicon oxide-based etch stop layer. Likewise, where a silicon dioxide-based dielectric layer is used, a silicon nitride etch stop layer may be used to stop a fluorine-based etching process.

However, the use of an etch stop layer within a dielectric layer creates a greater number of total layers in a device, and therefore a greater number of interfaces between layers within the device. It also requires separate deposition steps to be used for depositing the first layer of low k material, the etch stop layer, and the second layer of the low k material, thereby increasing the complexity of device fabrication.

Where the dielectric material is an inorganic material and the etch stop layer is silicon nitride, silicon carbide or other silicon based materials, it may be possible to deposit both the dielectric material and the etch stop layer via chemical vapor deposition ("CVD") processes using a single CVD system (possibly with separate chambers for each process). However, the dielectric constants of current inorganic dielectric materials are generally limited to $k \geqq 3.0$, and therefore may not be suitable for use in sub-65 nm circuits, which may require dielectric constants of $k \leqq 2.5$.

Some organic dielectric materials may have suitably low dielectric constants. However, many conventional organic dielectric films are deposited via spin-on processes. The use of a spin-on deposition process may be less clean than a CVD process. Furthermore, this may require the use of separate tools to deposit the organic material and the etch stop layer, as many etch stop materials are deposited by CVD.

SUMMARY

A method of forming a hybrid inorganic/organic dielectric layer on a substrate for use in an integrated circuit is provided, wherein the method includes forming a first dielectric layer on the substrate via chemical vapor deposition, and forming a second dielectric layer on the first dielectric layer via chemical vapor deposition, wherein one of the first dielectric layer and the second dielectric layer is formed from an organic dielectric material, and wherein the other of the first dielectric layer and the second dielectric layer is formed from an inorganic dielectric material.

BRIEF DESCRIPTION OF THE DRAWINGS

FIG. 5 is a greatly magnified, sectional view of the embodiment of FIG. 1, wherein a via is etched through the organic dielectric layer.

FIG. 6 is a greatly magnified, sectional view of the embodiment of FIG. 5, wherein the via is etched through the inorganic dielectric layer, and wherein a patterned layer of resist is formed on the hard mask and in the via.

FIG. 7 is a greatly magnified, sectional view of the embodiment of FIG. 6, wherein a trench is etched through the hard mask and the organic dielectric layer.

FIG. 8 is a greatly magnified, sectional view of the embodiment of FIG. 7, wherein the layer of resist is removed from the hard mask and the via.

FIG. 9 is a greatly magnified, sectional view of the embodiment of FIG. 8, wherein a barrier layer and an electrically conductive material are deposited within the trench and via.

DETAILED DESCRIPTION OF THE DEPICTED EMBODIMENTS

Figure 1:
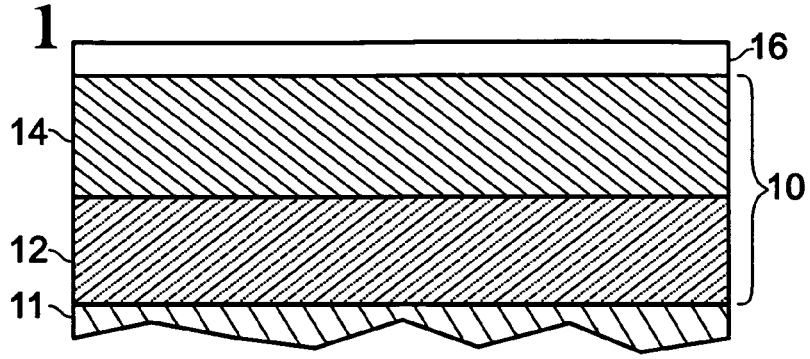
FIG. 1 is a greatly magnified, sectional view of an embodiment of a hybrid dielectric film including an inorganic dielectric layer and an organic dielectric layer, and a hard mask formed on the hybrid dielectric film.

FIG. 1 is a sectional view of an embodiment of a hybrid organic/inorganic dielectric film 10 formed on a substrate 11. Generally, hybrid dielectric film 10 includes an inorganic dielectric layer 12 formed from an inorganic low dielectric constant material, and an organic dielectric layer formed 14 from an organic low dielectric constant material. While inorganic dielectric layer 12 is depicted as being below organic dielectric layer 14 (i.e. the inorganic dielectric layer is deposited before the organic dielectric layer), it will be appreciated that the inorganic dielectric layer may also be disposed above organic dielectric layer 14 (i.e. may be deposited after the organic layer). FIG. 1 also shows a hard mask layer 16 formed over organic dielectric layer 14. Hard mask layer 16 is used to protect organic dielectric layer 14 from damage caused by a polishing step in a dual damascene process, described in more detail below. Hybrid dielectric film 10 and hard mask layer 16 are typically used as inter-metal-layers in an integrated circuit. Thus, other layers (not shown for purposes of clarity) are typically disposed over hybrid dielectric film 10 and hard mask layer 16.

Inorganic dielectric layer 12 and organic dielectric layer 14 are formed from materials with different etching chemistries. Therefore, the use of hybrid dielectric film 10 in a dual damascene process allows a separate etch stop layer to be omitted, as an etching process used to etch organic dielectric layer 14 will essentially stop upon reaching inorganic dielectric layer 12. This allows a device to be fabricated with fewer total layers (and therefore fewer interfaces between layers in the device), and allows the via and trench structures to be etched in fewer overall steps than where an etch stop layer is used.

CVD processes may be used to form both inorganic dielectric layer 12 and organic dielectric layer 14. For example, the depositions of such inorganic dielectric materials as $SiO_2$, fluorine-doped derivatives of $SiO_2$ or "fluorinated silicon glass" (FSG), and C and H doped derivatives of $SiO_2$ such as $SiO_xC_yH_z$, by CVD are known. Typically, these materials are formed via plasma-enhanced CVD processes that utilize an oxidative plasma to form the oxide. Useful low dielectric constant inorganic materials generally have dielectric constants of approximately 3 or higher.

On the other hand, many conventional organic low k dielectric materials are deposited by spin-on processes. The use of spin-on processes requires a substrate to be removed from the vacuum environment of the CVD system for the spin-on process to be performed, and then requires post-treatments to remove solvents from the spun-on material.

Other organic low k dielectric materials, however, may be deposited via CVD processes. For example, organic low k dielectric materials of the general formula (I) may be deposited via CVD processes.

$$X'_m\text{—}Ar\text{—}(CZZ'Y)_n \qquad (I)$$

In this formula, X' and Y are leaving groups that can be removed to form a free radical for each removed leaving group, Ar is an aromatic group or a fluorine-substituted aromatic group to which m X' groups and n CZZ'Y groups are bonded, and Z and Z' are H, F or $C_6H_{5-x}F_x$ (x=0, or an integer between 1 and 5). For example, where m=0 and n=2, removal of the leaving group Y from each CZZ'Y functional group yields the diradical Ar(CZZ'*)$_2$. Some compounds in which Z and Z' are F may have better dielectric properties and improved thermal stability compared to similar compounds in which Z and Z' are species other than F. Examples of suitable leaving groups for X' and Y include, but are not limited to, ketene and carboxyl groups, bromine, iodine, —NR$_2$, —N$^+$R$_3$, —SR, —SO$_2$R, —OR, =N$^+$=N—R, —C(O)N$_2$, and —OCF—CF$_3$ (wherein R is an alkyl or aromatic group). The numbers m and n in formula (I) may independently be either zero or an integer, and (n+m) is equal to or greater than two, but no greater than the total number of sp$^2$ hybridized carbons in the aromatic group that are available for substitution.

Ar in formula (I) may be any suitable aromatic group. Examples of suitable aromatic groups for Ar include, but are not limited to, the phenyl moiety $C_6H_{4-n}F_n$ (n=0 to 4); the naphthenyl moiety $C_{10}H_{6-n}F_n$ (n=0 to 6); the di-phenyl moiety $C_{12}H_{8-n}F_n$ (n=0 to 8); the anthracenyl moiety $C_{12}H_{8-n}F_n$ (n=0 to 8); the phenanthrenyl moiety $C_{14}H_{8-n}F_n$ (n=0 to 8); the pyrenyl moiety $C_{16}H_{8-n}F_n$ (n=0 to 8); and more complex combinations of the above moieties such as $C_{16}H_{10-n}F_n$ (n=0 to 10). Isomers of various fluorine substitutions on the aromatic moieties are also included. More typically, Ar is $C_6F_4$, $C_{10}F_6$, or $C_6F_4$—$C_6F_4$.

In particular, first continuous polymer layer 14 may be formed from a polymer of a general class of polymers called poly(paraxylylene)s ("PPX"). This class of polymers has a general repeat unit of (—CZ$^1$Z$^2$—Ar—CZ$^3$Z$^4$—), wherein Z$^1$, Z$^2$, Z$^3$ and Z$^4$ are similar or different. In specific embodiments, each individually are H, F or an alkyl or aromatic group. In one specific embodiment, a fluoropoly(paraxylylene) known as "PPX-F" is used. This polymer has a repeat unit of (—CF$_2$—C$_6$H$_4$—CF$_2$—), and may be formed from various precursors, including but not limited to BrCF$_2$—C$_6$H$_4$—CF$_2$Br.

Poly(paraxylylene)s and other polymers formed from precursors of general formula (I) may be formed via the CVD technique of transport polymerization. Transport polymerization involves generating a gas-phase reactive intermediate from a precursor molecule at a location remote from a substrate surface, and then transporting the gas-phase reactive intermediate to the substrate surface for polymerization. In the specific example of PPX-F formed from the precursor BrCF$_2$—C$_6$H$_4$—CF$_2$Br, the precursor may be converted by the removal of the bromine atoms into the reactive intermediate *CF$_2$—C$_6$H$_4$—CF$_2$*, wherein * denotes a free radical. This reactive intermediate may then be condensed onto a substrate surface, where polymerization takes place. Careful control of deposition chamber pressure, reactive intermediate feed rate and substrate surface temperature can result in the formation of a PPX-F film having a high level of initial crystallinity. The film may then be annealed to recrystallize it in a more dimensionally and thermally stable phase, as described in more detail below. Methods for forming PPX films are described in U.S. Pat. No. 6,703,462 ("the '462 patent"), issued on Mar. 9, 2001, the disclosure of which is hereby incorporated by reference. The methods disclosed in the '462 patent have been found to produce PPX-F films with dielectric constants on the order of 2.22 or lower.

Figure 2:
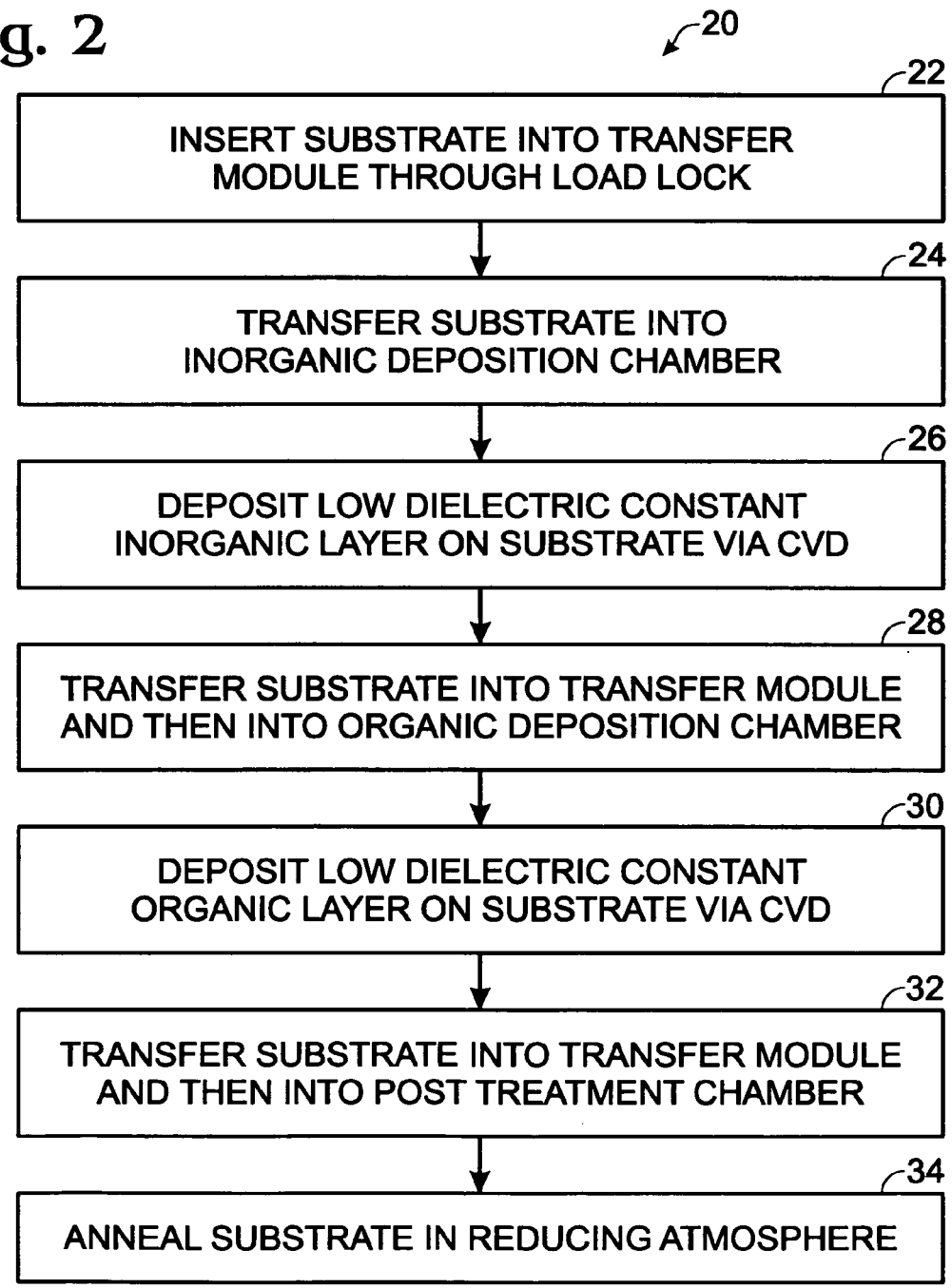
FIG. 2 is a flow diagram showing an embodiment of a method of forming a hybrid dielectric film on a substrate.

As described above, where inorganic dielectric layer 12 and organic dielectric layer 14 are both formed via CVD techniques, both may be deposited through the use of a single cluster system or tool. This may allow hybrid dielectric film 10 to be formed without breaking vacuum, thereby increasing the speed at which a device utilizing film 10 can be fabricated and increasing system throughput. One embodiment of a method of forming hybrid dielectric film 10 without breaking vacuum is illustrated generally at 20 in FIG. 2, and a block diagram of an exemplary embodiment of a suitable system for performing method 20 is shown generally at 100 in FIG. 3.

Figure 3:
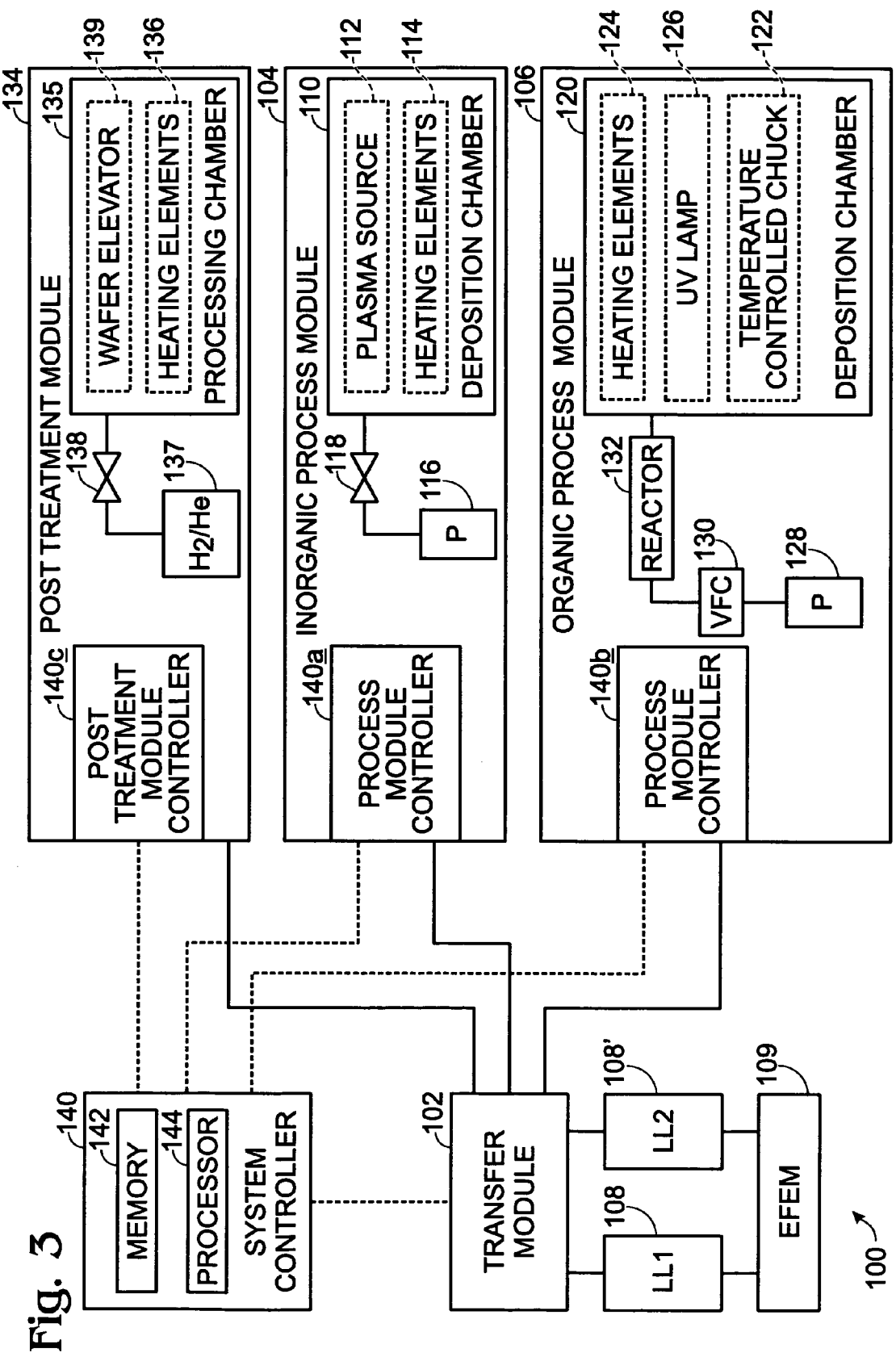
FIG. 3 is a block diagram of an embodiment of a system for forming a hybrid dielectric layer on a substrate.

Method 20 first includes, at 22, inserting a substrate into a CVD system by inserting it into a transfer module via a load lock. The transfer module, one embodiment of which is depicted schematically at 102 in FIG. 3, is connected to both an inorganic process module 104 configured to deposit the inorganic dielectric material, and an organic process module 106 configured to deposit the organic dielectric material. The load lock, shown at 108, also interfaces with an equipment front-end module (EFEM) 109, which allows substrates to be inserted into the load lock from an exterior environment. A second load lock 108' may be provided for more efficient transfer of substrates into and out of system 100.

Transfer module 102 is configured to maintain a selected reduced-pressure environment, and load lock 108 is provided to allow substrates to be inserted into transfer module 102 with less pumping time than would be required if transfer module 102 were brought to atmospheric pressure for the insertion of substrates.

Referring again to FIG. 2, the substrate is next transferred at 24 from transfer module 102 into an inorganic deposition chamber that is part of inorganic process module 104. This inorganic deposition chamber is illustrated schematically at 110 in FIG. 3. Inorganic deposition chamber 110 may include any suitable components for forming a selected inorganic dielectric layer. For example, where inorganic process module 104 is configured to deposit an inorganic material via plasma-enhanced CVD, inorganic deposition chamber 110 may include a plasma source 112 (for example, one or more pairs of electrodes), one or more heating elements 114 (for example, hot plates or radiant heaters), etc. Inorganic process module 104 may also include a precursor source 116 for admitting a flow of a precursor into inorganic deposition chamber 110, and one or more valves 118, mass flow controllers (not shown), etc. for admitting a flow of the precursor into inorganic deposition chamber 110.

Referring again to FIG. 2, after transferring the substrate into the inorganic chamber at 24, an inorganic dielectric layer is deposited onto the substrate. Details of forming inorganic dielectric films via CVD are well known in the art, and are therefore not described in further detail herein. Examples of specific methods of forming inorganic dielectric films are found in U.S. Pat. Nos. 6,140,456, 6,287,961, and 6,251,770.

After depositing the inorganic dielectric layer onto the substrate at 26, the substrate is then transferred at 28 into the transfer chamber 102 and then into an organic deposition chamber associated with organic process module 104. It will be appreciated that a vacuum environment may be maintained through this transfer process, which allows the hybrid dielectric film to be deposited in a quick and clean manner. Typically, transfer chamber 102 has a slightly higher pressure than inorganic deposition chamber 110 or the organic deposition chamber during transfer of the substrate between these chambers to help prevent cross-contamination of the two deposition chambers. Suitable levels of vacuum for transfer module 102 during transfer of a substrate into and out of organic deposition chamber 110 and inorganic deposition chamber 120 include, but are not limited to, pressures equal to or below approximately 0.1 Torr.

The organic deposition chamber is illustrated schematically at 120 in FIG. 3. Organic deposition chamber 120 may include any suitable components for forming a desired low dielectric constant organic film. For example, where organic process module 106 is configured to deposit a poly(paraxylylene)-based material via transport polymerization, organic deposition chamber 120 may include a temperature-controlled chuck 122 for controlling the temperature of the substrate during the transport polymerization process, one or more heating elements 124 (for example, hot plates or radiant heaters), a UV lamp 126 for initiating a polymerization reaction (depending upon the precursor used in organic deposition chamber 120) or to remove adsorbed moisture or small contaminant molecules on substrate before deposition of organic dielectric material, etc.

Organic deposition chamber 120 may be configured to hold a vacuum of 0.01 mTorr or lower prior to the deposition of organic dielectric layer 14. Furthermore, organic deposition chamber 120 may be configured to have a leakage rate of approximately 2 mTorr/min or less, and in some embodiments, as low as 0.4 mTorr/min or less.

Organic process module 106 may also include a precursor source 128 for supplying a precursor for the transport polymerization process, a mass or vapor flow controller 130 for controlling a quantity of precursor used in the transport polymerization reaction, and/or a reactor 132 for forming a reactive intermediate species from the precursor for the transport polymerization process. In the specific example of PPX, U.S. patent application Ser. No. 10/854,776, which was filed by Lee et al. on May 25, 2004 and is hereby incorporated by reference, discloses a thermal reactor suitable for forming reactive intermediates from various precursors, including but not limited to precursors having a general formula of $BrCX^1X^2$—$C_6H_{4-x}F_x$—$CX^3X^4Br$. For this specific precursor, precursor source 128 may be configured to maintain a temperature of between approximately 40 and 90 degrees Celsius to create a sufficient vapor pressure of the precursor. Likewise, vapor flow controller 130 may be configured to admit any suitable flow of precursor vapor into reactor 132. Examples of suitable flows include, but are not limited to, flow rates between 1 and 50 sccm, ±1 sccm.

Referring again to FIG. 2, after transferring the substrate into the organic deposition chamber at 28, the organic dielectric layer is deposited at 30. Any suitable CVD method may be used to deposit the organic dielectric layer. In specific example of PPX, a detailed description of the formation of PPX films via transport polymerization is found in the above-incorporated U.S. Pat. No. 6,703,462.

After depositing the organic dielectric layer in the organic deposition chamber, the substrate may next be transferred at 32 into the transfer chamber and then into a post treatment chamber for any desired post-deposition treatments. For example, as indicated at 34 in FIG. 2, the substrate may be annealed in the post treatment chamber to improve the physical characteristics of the inorganic or organic dielectric layers, to cap any free radicals remaining from the transport polymerization process, to improve the adhesion between the inorganic and organic dielectric layers, etc.

Many poly(paraxylylene)-based polymers, including but not limited to PPX-F, may have several different solid phases that exist at different temperatures and/or pressures. For example, many poly(paraxylylene)-based polymers, including PPX-F, have at least an alpha-1 phase, a beta-1 phase and a beta-2 phase.

The alpha-1 phase is a solid phase that exists at lower temperatures. Because the synthesis of PPX-based films by transport polymerization is often performed at low temperatures, relatively large amounts of alpha-1 phase PPX-based materials may be initially formed by transport polymerization. Many PPX materials undergo an irreversible phase transition between the alpha-1 phase and beta-1 phase when heated to a sufficiently high temperature. In this case, an annealing step may be used to convert an as-deposited PPX film to a more dimensionally stable beta-1 phase. Furthermore, many PPX materials undergo a reversible beta-1 to beta-2 phase transition at a higher temperature. It has been found that many PPX-based polymers can be trapped in the beta-2 phase by first heating to a temperature above the beta-1 to beta-2 phase transition temperature, holding the PPX-based film at an elevated temperature for a duration of, for example, 1-120 minutes, and then cooling the film at a fairly rapid rate, for example, at a rate of 10° C./sec or faster, to a temperature below the beta-1 to beta-2 phase transition temperature. In this case, an annealing step followed by a rapid cooling step may be used to trap a film in a beta-2 phase so that, in the event that the film will have to undergo further processing steps at temperatures higher than the beta-1 to beta-2 phase transition temperature, no dimension-changing beta-1 to beta-2 phase transition will occur. It will be appreciated that the temperature, time and heating/cooling rate ranges set forth above are merely exemplary, and that conditions outside these ranges may also be used in an annealing process.

In the specific example of PPX-F, the alpha-i to beta-1 phase transition occurs at approximately from 250 to 300° C., the beta-1 to beta-2 phase transition occurs at approximately from 350 to 400° C., and the melting point is approximately from 485 to 515° C. "Any suitable annealing process may be used to anneal the substrate after depositing the organic dielectric layer. For example, the substrate may be annealed under any suitable pressure, and under any suitable atmospheric composition. In one embodiment, the substrate is annealed under a reducing atmosphere. The use of a reducing atmosphere may help to cap any unreacted free radicals in the organic dielectric layer with a species such as hydrogen or fluorine. Examples of suitable reducing atmospheres include, but are not limited to, atmospheres including fluorine, hydrogen, and fluorine or hydrogen mixed with argon. Where hydrogen is mixed with a diluent gas, suitable concentrations of hydrogen gas include, but are not limited to, concentrations greater than 0.1% by volume. Furthermore, a silane compound may be included in the reductive atmosphere as an adhesion-promoting compound to improve adhesion at organic-inorganic interfaces. Examples of suitable silane compounds include, but are not limited to, those silane compounds listed in the commonly assigned U.S. patent application Ser. No. 10/816,205 Lee, filed on Mar. 31, 2004, the disclosure of which is hereby incorporated by reference."

FIG. 3 shows, generally at 134, an exemplary post treatment module for annealing a substrate after depositing the inorganic and organic dielectric layers. Post treatment module 134 includes a processing chamber 135 in which post-deposition processing occurs, one or more heating elements 136 (for example, hot plates or radiant heaters) for heating the substrate or substrates in processing chamber 135, an annealing gas source 137, and one or more valves 138 for controlling a flow of annealing gas into chamber 135. Post treatment module 132 may also include a wafer elevator 139 or like device for batch processing.

The annealing process may be performed at any suitable pressure. Suitable pressures include, but are not limited to, pressures between approximately 2 and 10 Torr. Likewise, any suitable heat source may be used for the annealing process. Suitable heat sources include, but are not limited to, hot plates, radiant heat sources, etc.

Hybrid dielectric film 30 may be annealed at any suitable temperature. In the specific example of PPX-F as an organic dielectric layer, hybrid dielectric film 10 may be annealed at a temperature, for example, up to between 50° to 90° C. below a melting temperature of the organic dielectric layer. Examples of specific temperatures at which a PPX-F film may be annealed include, but are not limited to, temperatures in the range of approximately 300-450 degrees Celsius. Hybrid dielectric film 10 may be maintained at an isothermal temperature for a period of time, including but not limited to periods of time between about 1 and 120 minutes. The film may then be cooled to give the final hybrid dielectric film 10. In the specific example of PPX-F, the cooling rate is between about 30° C. and about 100° C./sec, and hybrid dielectric film 10 is cooled at this rate to a temperature that is at least about 20° to about 50° C. below the beta-1 to beta-2 phase transition temperature of organic dielectric layer 14.

To avoid free radical scavengers such as oxygen from contaminating organic dielectric layer 14 before the reductive annealing process by reacting with unreacted free radicals, the steps of method 20 may be performed in a system having a low leakage rate. Suitable leakage rates include, but are not limited to, leakage rates of less than approximately 2 mTorr/min, and preferably, below 0.4 mTorr/min, depending upon the volume of the chamber.

System 100 also includes a system controller 140 having memory 142 with instructions stored thereon that are executable by a processor 144 for controlling the various parts of system 100 to effect the formation of hybrid dielectric film 10. System controller 140 is in electrical communication with an inorganic process module controller 140a on inorganic process module 104, an organic treatment controller 140b on organic process module 106, a post treatment module controller 140c on post treatment module, and transfer module 102. System controller 140 may also include connections to any other component having electrical systems, including but not limited to load locks 108 and 108', equipment front-end module 109, and any sub-components contained within the general components shown in FIG. 3. It will be appreciated that the electrical connections shown in FIG. 3 merely set forth an exemplary hardware architecture, and do not indicate a particular physical relationship between the system controller and individual module controllers. Moreover, it will be appreciated that the depicted hardware architecture is merely exemplary, and that system 100 may utilize any other suitable architecture. For example, a single controller may be used to control all functions of all modules, rather than having a controller for each module. Furthermore, while only system controller 140 is depicted as having memory and a processor, each of the individual module controllers typically also has memory and one or more processors associated therewith.

System controller 140 electronically communicates with inorganic process module controller 140a to start and finish the inorganic dielectric layer deposition process, while inorganic process module controller 140a directs process module 302 to perform the various functions and operations that produce layer 12 of hybrid dielectric film 10. For example, inorganic process module controller 140a maintains a desired vacuum within inorganic deposition chamber 110 via a vacuum pump system (not shown), controls the temperature distribution of the heating elements 114, delivers a desired amount of precursor from precursor source 116 into deposition chamber 110 through valve system 118, etc.

System controller 140 likewise electronically communicates with organic process module controller 140b to start and finish the organic dielectric layer deposition process, while organic process module controller 140*b* directs organic process module 106 to perform the various functions and operations that produce organic dielectric layer 14 of hybrid dielectric film 10. For example, organic process module controller 140*b* maintains the clean vacuum environment for organic deposition chamber 120 and reactor 132 via a vacuum pump system (not shown), controls the temperature distribution of the heating elements 124, delivers a desired amount of precursor from precursor source 128 into deposition chamber 120 through vapor flow controller 130 and reactor 132, etc.

System controller 140 also electronically communicates with post treatment module controller 140*c* to direct post treatment module 134 to perform the various functions and operations that go into the post-deposition processing of hybrid dielectric film 10. For example, post treatment module controller 140*c* may regulate the hybrid dielectric film annealing temperature through heating elements 136, maintain a desired hydrogen/helium pressure within processing chamber 135 via annealing gas source 137 and controlling valve 138, control the vertical indexing motion of the wafer elevator 139 for substrate transfer into and out of post treatment module 134, etc.

Transfer module 102, equipment front-end module 109, and load locks 108 and 108' each may be considered part of a platform that supports use of inorganic process module 104, organic process module 106 and post treatment module 134. During a deposition process, a substrate is loaded initially into equipment front-end module 109, where alignment systems within the equipment front-end module pre-align the substrate. The substrate is then moved via a mechanical arm or other transfer apparatus (not shown in FIG. 3) within equipment front-end module 109 to load lock 108 (or 108'), which is pumped down to a pressure of a few mTorr. From load lock 108 (or 108'), another substrate transfer apparatus (not shown in FIG. 2) within transfer module 102 transfers the substrate from load lock 108 (or 108') into transfer module 102, and then into inorganic process module 104.

Transfer module 102 is also controllable by system controller 140 to transfer a substrate between inorganic process module 104, organic process module 106 and post treatment module 134 at appropriate times during the fabrication of hybrid dielectric film 10. To help prevent reaction of unreacted free radicals in the organic dielectric layer while the substrate is being transferred between organic process module 106 and post treatment module 134, transfer module 102 may be maintained at a suitable level of vacuum. Suitable levels of vacuum include, but are not limited to, pressures below 0.1 Torr.

Once all processing steps have been completed, transfer module 102 may be directed by system controller 140 to transfer a substrate into load lock 108 (or 108'), where it may be brought back to the pressure of equipment front-end module 109 for removal from system 100.

Figure 4:
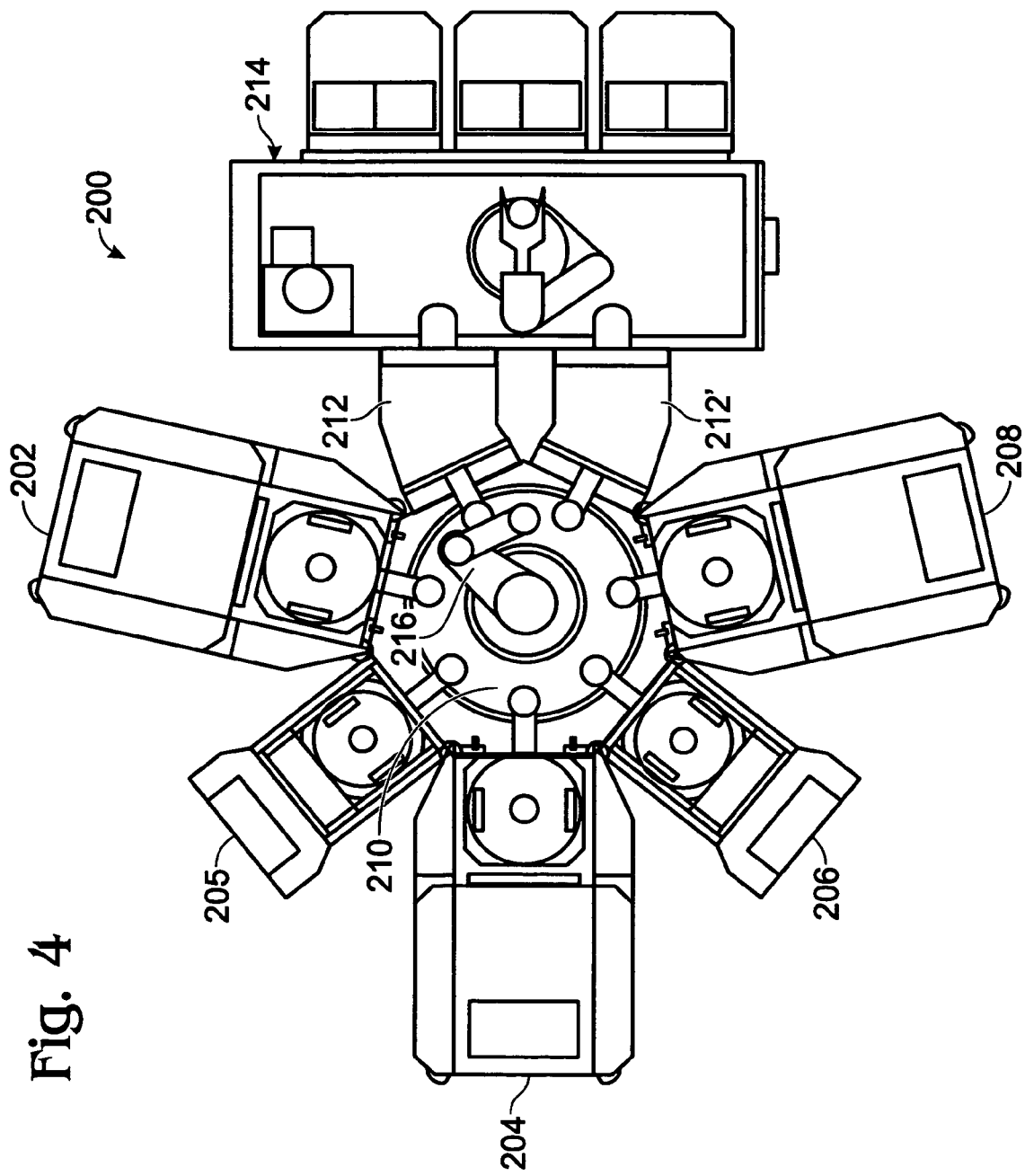
FIG. 4 is a plan view of another embodiment of a system for forming a hybrid dielectric layer on a substrate.

FIG. 4 shows, generally at 200, a plan view of another embodiment of a processing system for forming hybrid dielectric film 10. System 200 includes an inorganic process module 202, an organic process module 204, two post treatment modules 205 and 206, and an auxiliary module 208 that may be either an inorganic process module or an organic process module to increase throughput as desired. A transfer module 210 is disposed in a central location, and the inorganic process module 202, the organic process module 204, the post treatment modules 206, load locks 212 and 212', and an equipment front-end module 214 are disposed around and connected to the transfer module. Transfer module 210 includes a pivotal mechanical arm 216 configured to transfer a substrate between load locks 210 and 210', inorganic process module 202, organic process module 204, and post treatment modules 206. The depicted configuration of system 200 allows a substrate to be transferred between the various processing chambers without breaking the overall system vacuum.

Substrates may be sequentially or batch processed in inorganic process module 202 and organic process module 204, and then annealed in post treatment module 206 in a batch manner for a high system throughput. Using the above-disclosed processing equipment and conditions, hybrid dielectric film 10 can be deposited and annealed on a substrate in 4 to 6 minutes, which is within the time tolerances dictated by the overall fabrication speed of typical integrated circuit processing lines. It will be appreciated that the system configuration shown in FIG. 4 is merely exemplary, and that any other suitable arrangement of the various components of system 200 may be used.

As described above, the use of hybrid dielectric film 10 in a dual damascene process may allow via and trench structures to be etched in fewer total steps than in a monolithic dual damascene process that employs an etch stop layer. FIGS. 5-9 illustrate an exemplary dual damascene technique utilizing hybrid dielectric film 10. Referring first to FIG. 5, a via 300 is etched through hard mask layer 16 and organic dielectric layer 14. Via 300 is typically formed by first depositing and patterning a layer of resist on hard mask layer 16, etching through hard mask layer 16, and then etching through organic dielectric layer 14. Different etching processes may be used for etching hard mask layer 16 and organic dielectric layer 14 due to the potential differences in etching chemistries between these materials.

Because organic dielectric layer 14 and inorganic dielectric layer 12 are etched by different etching chemistries, the etching process used to etch via 300 through organic dielectric layer 14 essentially stops upon reaching inorganic dielectric layer 12.

Next referring to FIG. 6, via 300 is etched through inorganic dielectric layer 12, completing the etching of the via. This may require re-depositing and patterning of resist, as the etching process used to etch organic dielectric layer 14 also may cause removal of the resist used to pattern the via for the organic dielectric layer etching.

The total number of etching steps used to etch the via as described above is three—one step for the hard mask layer, one step for the organic dielectric layer, and one step for the inorganic dielectric layer. In contrast, in a monolithic dual damascene process utilizing an organic dielectric layer with an embedded etch stop layer, four etching steps may be required to etch a similar via—one step for the hard mask layer, one for the organic dielectric material over the etch stop layer, one for the etch stop layer, and one for the organic dielectric material beneath the etch stop layer.

After etching via 300 through inorganic dielectric layer 12 (and removing the resist used in the via etching process), a layer of photoresist 302 is deposited over hard mask 16 and in the bottom of via 300, and is then patterned in an appropriate manner for etching a trench structure through hard mask layer 16 and organic dielectric layer 14. In the patterning process, some resist 302' is left at the bottom of via 300 due to the effect the depth of the via has on the focus of the radiation used to pattern the layer of photoresist 302. Resist 302' may help to protect substrate 11 from damage during the trench etching process.

Next referring to FIG. 7, a trench 304 is etched through hard mask layer 16 and organic dielectric layer 14. Different etching processes may be used to etch hard mask layer 16 and organic dielectric layer 14 where the materials used for these layers have different etching chemistries. The process used to etch trench 304 through organic dielectric layer 14 essentially stops upon reaching inorganic dielectric layer 12. Therefore, the use of inorganic dielectric layer 12 allows trench 304 to be etch to a consistent and precise depth without the use of a separate etch stop layer.

Referring next to FIG. 8, after trench 304 has been etched through organic dielectric layer 14, photoresist layer 302 and 302' may be removed, which readies trench 304 and via 300 for the deposition of an electrically conductive material, such as copper, into the trench and via. FIG. 9 shows the final structure after depositing the electrically conductive material into trench 304 and via 300.

Typically, the electrically conductive material is deposited as follows. First, a barrier layer 310 is first deposited in via 300 and trench 304 to prevent diffusion of copper into hybrid dielectric layer 10. Tantalum is often used for barrier layer 310; however, any other suitable material may be used. Next, a copper seed layer 312 is deposited over the tantalum barrier layer, and then the remaining volume of via 300 and trench 304 is filled with copper by an electroplating process. The barrier layer deposition, seed layer deposition and electroplating processes also deposit material on hard mask layer 16. Therefore, a polishing step may be used to remove these materials from the areas of hard mask layer 16 surrounding via 300 and trench 304, and hard mask layer 16 protects organic dielectric layer 14 from damage during the polishing step. This produces the final structure shown in FIG. 9.

Using the materials, methods and systems disclosed above, a hybrid dielectric film 10 with an overall effective dielectric constant of 2.6 or lower may be formed, which is sufficiently low to support the fabrication of sub-65 nm integrated circuits. It will be noted that the systems disclosed herein may also be used to deposit to deposit a dielectric film for use in a monolithic dielectric process, rather than the hybrid dielectric film for the etch stop-less process described herein. In this case, a first organic layer may be formed on the substrate, followed by a thin inorganic etch stop layer, following by a second organic layer. This structure then may be capped with an inorganic hard mask, and the etching and metal deposition steps may then be performed.

While the embodiments shown and described in detail herein describe a hybrid dielectric film having an organic dielectric layer used for the trench layer of the dual damascene structure and an inorganic dielectric layer used for the via layer, it will be appreciated that the inorganic dielectric layer may be used for the trench layer and the organic may be used for the via layer without departing from the scope of the present invention. The dielectric material for the via layer of a dual damascene structure may require good mechanical strength and a compatible coefficient of thermal expansion with copper to help avoid "via collapse" failures in the dual damascene structure. Therefore, suitable organic dielectric materials for the via layer will have these characteristics. Likewise, the closeness of adjacent lines in the trench layer of a dual damascene structure may require lower dielectric constants than the via layer. Therefore, suitable inorganic materials for the trench layer will have a sufficiently low dielectric constant for a desired device scale.

Although the present disclosure includes specific embodiments of hybrid dielectric films, methods of forming the films, and systems for forming the films, specific embodiments are not to be considered in a limiting sense, because numerous variations are possible. The subject matter of the present disclosure includes all novel and nonobvious combinations and subcombinations of the various films, processing systems, processing methods and other elements, features, functions, and/or properties disclosed herein. The description and examples contained herein are not intended to limit the scope of the invention, but are included for illustration purposes only. It is to be understood that other embodiments of the invention can be developed and fall within the spirit and scope of the invention and claims.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. A method of forming a hybrid inorganic/organic dielectric layer on a substrate for use in an integrated circuit, the method comprising:
    forming a first dielectric layer on the substrate via chemical vapor deposition; and
    forming a second dielectric layer on the first dielectric layer via chemical vapor deposition;
    wherein one of the first dielectric layer and the second dielectric layer is formed from an organic polymer dielectric material comprising a repeating unit of $-CZ^1Z^2-Ar-CZ^3Z^4-$, where Ar is an aromatic group or a fluorine-substituted aromatic group, where $Z^1$, $Z^2$, $Z^3$, and $Z^4$ are each one of H, F, and $C_6H_{5-x}F_x$ (x=0, or an integer between 1 and 5); and
    wherein the other of the first dielectric layer and the second dielectric layer is formed from an inorganic dielectric material.

2. The method of claim 1, wherein the first dielectric layer is formed from an inorganic dielectric material and wherein the second dielectric layer is formed an organic polymer dielectric material.

3. The method of claim 1, further comprising annealing the hybrid dielectric layer in a reducing environment after depositing the second dielectric layer.

4. The method of claim 1, wherein the organic polymer material has a dielectric constant of 2.22 or lower.

5. The method of claim 1, wherein the inorganic material has a dielectric constant 3 or lower.

6. The method of claim 1, wherein the organic polymer dielectric material is formed by transport polymerization.

7. The method of claim 1, wherein the organic polymer dielectric material has a repeating unit of $-CF_2C_6H_4CF_2-$.

8. The method of claim 1, wherein the inorganic dielectric material is selected from the group consisting of $SiO_2$, fluorinated silicon glass, and $SiO_xC_yH_z$.

9. The method of claim 1, further comprising etching a trench through the second dielectric layer by using a chemically selective etch that etches the second dielectric layer at a higher rate than the first dielectric layer.

10. The method of claim 9, further comprising etching a via through the first dielectric layer by using a chemically selective etch that etches the first dielectric layer at a higher rate than the second dielectric layer after etching the trench through the second dielectric layer.

11. The method of claim 10, further comprising depositing an electrically conductive material in the trench and the via.

12. A method of forming a hybrid dielectric layer on a substrate via a chemical vapor deposition (CVD) system, the method comprising:

introducing the substrate into the CVD system;

isolating an atmosphere within the CVD system relative to an atmosphere outside of the CVD system;

depositing a first dielectric film via CVD onto the substrate in the CVD system; and depositing a second dielectric film onto the first dielectric film via CVD;

wherein one of the first dielectric film and the second dielectric film is an organic film formed by depositing, via CVD, an organic dielectric material of the general formula $X'_m$—Ar—$(CZZ'Y)_n$, where X' and Y are leaving groups removable to form a free radical for each removed leaving group, Ar is an aromatic group or a fluorine-substituted aromatic group, and Z and Z' each is one of H, F, or $C_6H_{5-x}F_x$ (x=0, or an integer between 1 and 5);

wherein the other of the first dielectric film and the second dielectric film is an inorganic film; and wherein the substrate isolated from the atmosphere outside of the CVD system during and between the depositing of the first and second dielectric films.

13. The method of claim 12, wherein the organic film is formed from a material having a repeating unit of —$CF_2C_6H_4CF_2$—.

14. The method of claim 12, wherein the inorganic film is formed from a material selected from the group consisting of $SiO_2$, fluorinated silicon glass, and $SiO_xC_yH_z$.

15. The method of claim 12, wherein the first dielectric film is the inorganic film, and the second dielectric film is the organic film.

16. The method of claim 12, wherein the CVD system has a first CVD chamber and a second CVD chamber, wherein the first dielectric film is deposited in the first CVD chamber, wherein the second dielectric film is deposited in the second CVD chamber, and further comprising transferring the substrate from the first CVD chamber to the second CVD chamber through a transfer chamber positioned between the first CVD chamber and the second CVD chamber after depositing the first dielectric film.

17. The method of claim 16, wherein the transfer chamber is maintained at a reduced pressure during the transferring of the substrate from the first CVD chamber to the second CVD chamber.

18. The method of claim 12, wherein the inorganic film is formed from a material having a dielectric constant of 3 or lower.

19. The method of claim 12, wherein the organic film is formed from a material having a dielectric constant of 2.2 or lower.

20. The method of claim 12, wherein the hybrid film has an effective dielectric constant of 2.6 or lower.

* * * * *